US006665227B2

(12) United States Patent
Fetzer

(10) Patent No.: US 6,665,227 B2
(45) Date of Patent: Dec. 16, 2003

(54) METHOD AND APPARATUS FOR REDUCING AVERAGE POWER IN RAMS BY DYNAMICALLY CHANGING THE BIAS ON PFETS CONTAINED IN MEMORY CELLS

(75) Inventor: Eric S Fetzer, Longmont, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 280 days.

(21) Appl. No.: 10/045,529

(22) Filed: Oct. 24, 2001

(65) Prior Publication Data
US 2003/0076701 A1 Apr. 24, 2003

(51) Int. Cl.[7] .................................................. G11C 5/14
(52) U.S. Cl. ........................ 365/229; 365/227; 365/226; 365/189.09
(58) Field of Search ................................. 365/154, 156, 365/149, 189.09, 226, 227, 228, 229

(56) References Cited

U.S. PATENT DOCUMENTS 5,726,944 A * 3/1998 Pelley et al. ................ 365/226
6,448,811 B1 * 9/2002 Narendra et al. ............. 326/82

* cited by examiner

Primary Examiner—Andrew Q. Tran
(74) Attorney, Agent, or Firm—John Pessetto

(57) ABSTRACT

A circuit for reducing power in SRAMS and DRAMS is implemented by dynamically controlling a voltage applied to Nwells containing PFETs used in memory cells. When a memory cell is in standby, the voltage applied to Nwells containing PFETs is increased in order to reduce leakage current. When a memory cell is being written, read, or refreshed, the voltage applied to Nwells containing PFETs is reduced in order to allow the memory cell to switch more quickly.

40 Claims, 5 Drawing Sheets

METHOD AND APPARATUS FOR REDUCING AVERAGE POWER IN RAMS BY DYNAMICALLY CHANGING THE BIAS ON PFETS CONTAINED IN MEMORY CELLS

FIELD OF THE INVENTION

This invention relates generally to electronic circuits. More particularly, this invention relates to reducing average power in SRAMs and DRAMs.

BACKGROUND OF THE INVENTION

As more electronic circuits are included on a single die, the power dissipated by a single die continues to increase. In order to keep the temperature of a single IC (integrated circuit) at a reasonable temperature, many techniques have been used. For example, elaborate cooling fins have been attached to the substrate of ICs. Also, fans have been positioned near a group of IC's to cool them. In some cases, liquids have been used to reduce the heat produced by ICs. These solutions can be costly and may require a great deal of space, where space is at a premium. If the power on ICs can be reduced while still achieving higher levels of integration, the cost and area of devices that use ICs may be reduced.

The number of bits contained on a semiconductor memory chip, has, on average, quadrupled every three years. As a result, the power that semiconductor memories consume has increased. Computer systems can use large numbers of stand-alone semiconductor memories. Part of the semiconductor memory used by these computer systems, may be held in standby mode for a certain amount of time. The portion of memory that is held in standby is not accessed for data and as result, has lower power requirements than those parts of semiconductor memory that are accessed. Part of the power used in stand-by mode is created by leakage current in each individual memory cell of the semiconductor memory. Because the amount of memory used in a computer system or as part of a microprocessor chip is increasing, the power, as result of leakage current in semiconductor memory cells, is also increasing. The following description of an apparatus and method for reducing the leakage current in semiconductor memory cells addresses a need in the art to reduce power in ICs and computer systems.

SUMMARY OF THE INVENTION

An embodiment of the invention provides a circuit for reducing power in SRAM and DRAM, (only DRAM cells that use a PFET (P-type Field Effect Transistor) transfer transistor) memory cells during standby. A variable voltage is electrically connected to Nwell areas that contain PFETs used in memory cells. During standby, the voltage applied to the Nwells containing PFETs used in memory cells is increased. The increase in voltage to the Nwell area increases the value of the $V_t$ (threshold voltage) of the PFETs used in the memory cells. A higher $V_t$ reduces the leakage current through the PFETs and as a result lowers the standby power of the memory cells. During normal operation (e.g. read and write operations), the voltage to the Nwell is lowered and as a result the $V_t$ of the PFETs in the memory cells is lower. A lower $V_t$ in the PFETs used in the memory cells allows the cells to be read or written faster.

Other aspects and advantages of the present invention will become apparent from the following detailed description, taken in conjunction with the accompanying drawing, illustrating by way of example the principles of the invention.

DETAILED DESCRIPTION OF THE PREFERRED EMBODIMENT

Figure 1:
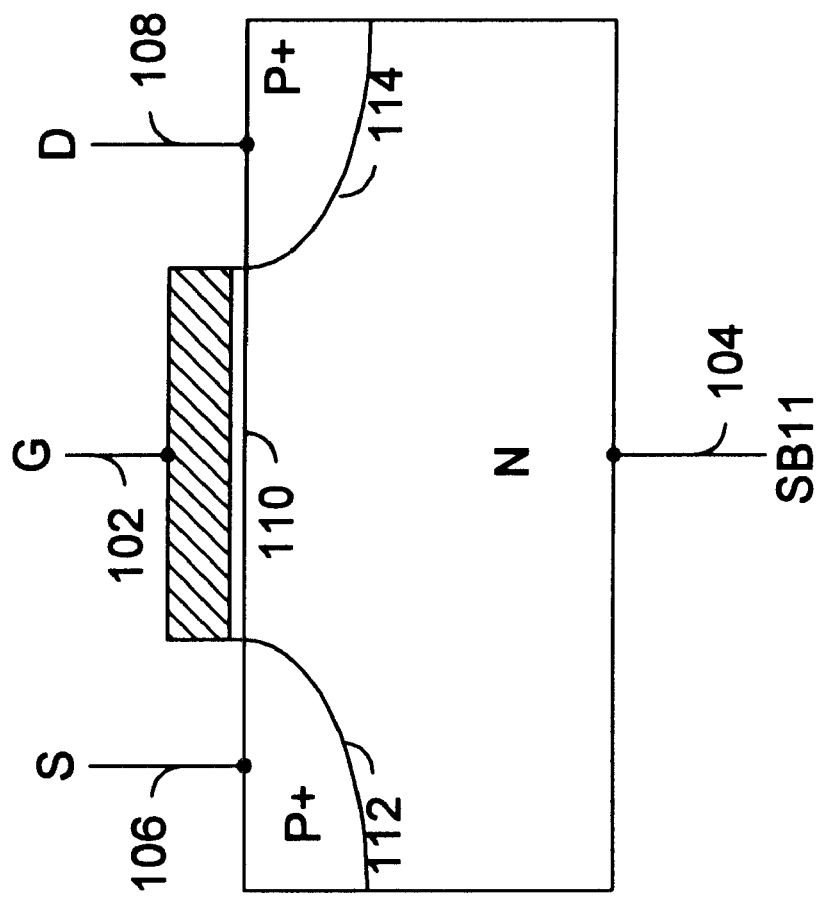
FIG. 1 is a cross-sectional drawing of a PFET transistor.

In FIG. 1, a cross-section of a PFET is illustrated. Node 102 is connected to a conducting material, poly-silicon or metal which forms, along with 110, a thin oxide, a gate, G of the PFET. Node 106 is connected to a P+ diffusion that forms the source, S, of the PFET. Node 108 is connected to a P+ diffusion that forms the drain, D, of the PFET. Node 104 is connected to an N-type material that forms the substrate, SB or Nwell of the PFET. The four nodes, 102, 104, 106, and 108 may be used to control the PFET. The voltage on node 104 must be at about the same voltage or higher than the voltages on nodes 106 and 108 in order to maintain a reverse bias. If the voltage on nodes 106 or 108 goes higher than approximately 0.7 volts, the diode formed by the P/N junction of node 112 or node 114 will forward bias and conduct current. This is usually not desired when using a PFET as a switch.

When node 102, G, is charged to a "low" voltage, a conductive P-type channel forms under the oxide, 110, electrically connecting nodes 106 and 108. When node 102, G, is charged to a "high" voltage, a significant channel does not form under the oxide, 110, and very little current can flow between nodes 106 and 108. The condition where a "high" voltage is applied to 102 is usually called "off" because only a small amount of current flows between nodes 106 and 108. However, even when the PFET is off, with a high voltage applied to node 102, the current flowing between nodes 106 and 108 is not zero. If a design, for a example an SRAM, uses millions of PFETs and has the majority of the PFETs turned "off", there can still be a relatively large loss of power due to the "small" leakage current contributed by the millions of individual PFETs. A mechanism for controlling this leakage would be useful.

The voltage at which a PFET is defined as being "on" is the threshhold voltage, $V_t$. When the voltage on the gate, node 102 is at or above the $V_t$, the PFET conducts a substantial current. When the voltage on the gate, node 102 is below the threshold voltage, the PFET current conducted between nodes 106 and 108 is relatively small. When the voltage on the gate, node 102, is below a $V_t$, the PFET is said to be off Even though the PFET is below a $V_t$ and is "off", the PFET still conducts current. The amount of current the PFET conducts when it is "off" is dependent, among other things, on the value of the $V_t$. The higher the value of $V_t$, the lower the leakage current of the PFET will be when the PFET is turned "off". One method of changing the $V_t$ of a PFET is to change the voltage on the Nwell that contains the PFET. The value of the $V_t$ of the PFET may be raised, allowing lower leakage current, by raising the voltage of the Nwell containing the PFET. Raising the voltage on a Nwell then reduces the leakage current of the PFET and therefore the power consumed by the PFET. While raising the voltage on the Nwell containing the PFET is ideal for reducing leakage current, it is not ideal for allowing a PFET to switch quickly. In a case where switching speed is important, a lower $V_t$ will allow the PFET to switch more quickly so a lower Nwell voltage would be desired. Because a SRAM and DRAM cell that uses PFETs requires both low leakage when PFETs are off and fast switching speeds when PFETs are on, a variable voltage on a Nwell containing the PFETS would be useful. When the PFETS are "off", the leakage could be reduced by increasing the voltage on the Nwell and when the PFETs are "on", the switching speed could be increased by lowering the voltage on the Nwell containing the PFETs.

Figure 2:
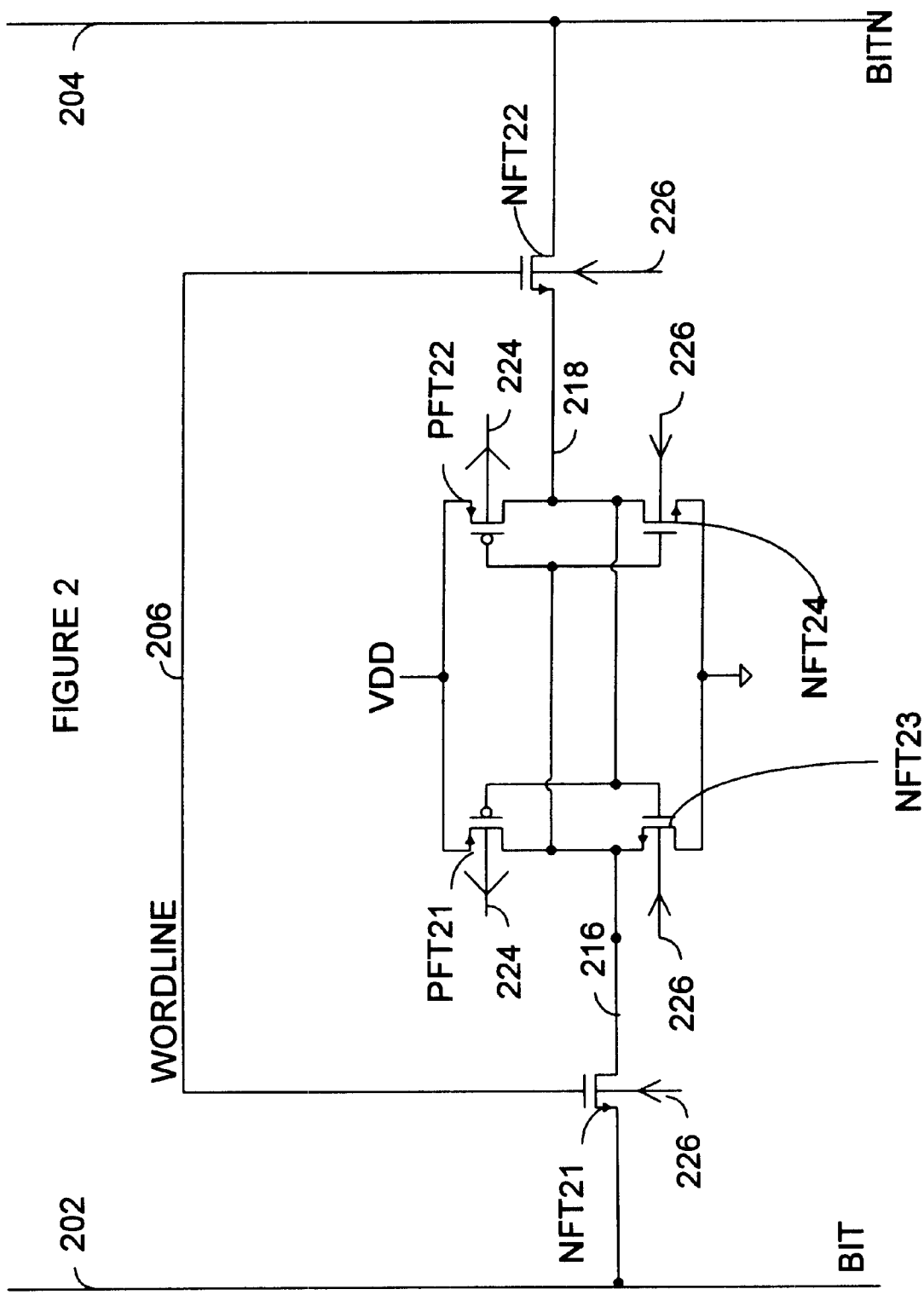
FIG. 2 is a schematic drawing of a SRAM memory cell.

FIG. 2 is a schematic drawing of a six transistor SRAM memory cell. The source of PFET, PFT21, and the source of PFET, PFT22 are connected to VDD. The drain, 216, of PFET, PFT21, the drain, 216 of NFET, NFT23, and the drain, 216 of NFET, NFT21 are connected at node 216. The drain, 218 of PFET, PFT22, the drain, 218 of NFET, NFT24, and the drain, 218 of NFET, NFT22 are connected at node 218. The source of NFET, NFT23 and the source of NFET, NFT24 are connected to GND. The gates of PFET, PFT21 and NFET, NFT23 are connected to node 218. The gates of PFET, PFT22 and NFET, NFT24 are connected to node 216. The gates of NFETs, NFT21 and NFT22, are connected to node 206, WORDLINE. The source of NFET, NFT21 is connected node 202, BIT and the source of NFET, NFT22 is connected node 204, BITN. The substrates of NFETS, NFT21, NFT22, NFT23, and NFT24 are connected to node 226. Node 226 may be grounded or a negative voltage may be applied. The Nwells of PFETs, PFT21 and PFT22, are connected at node 224. Node 224 is driven by a variable voltage source that allows the voltage to vary depending on the state of the memory. If the memory is in standby, node 224 is raised to a voltage higher than VDD. If the memory is active, node 224 is maintained at a voltage close to VDD. In this way, the $V_t$ of the PFETs, PFT21 and PFT22, may be raised or lowered to meet the requirements of lower power or faster switching speeds.

Figure 3:
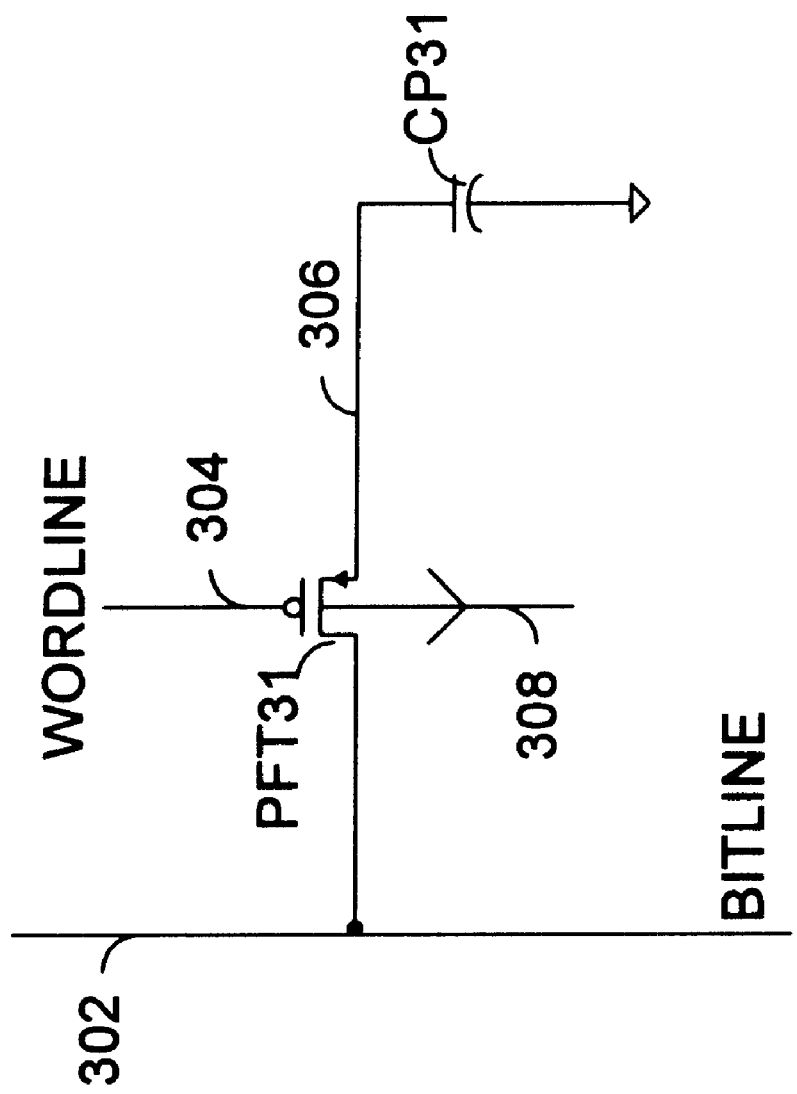
FIG. 3 is a schematic drawing of a DRAM memory cell.

FIG. 3 is a schematic drawing of a DRAM cell using a PFET as a transfer transistor. The gate of PFET, PFT31, is connected to node 304, WORDLINE. The drain of PFET, PFT31, is connected to node 306. One terminal of capacitor, CP31, is connected at node 306 and the other terminal of capacitor, CP31, is connected to GND. The source of PFET, PFT31, is connected to node 302, BITLINE. The Nwell of PFET, PFT31, is connected to node 308. Node 308 is driven by a variable voltage source that allows the voltage to vary depending on the state of the memory. If the memory is in standby, node 308 is raised to a voltage higher than VDD. If the memory is active, node 308 is maintained at a voltage close to VDD. In this way, the $V_t$ of the PFET, PFT31 may be raised or lowered to meet the requirements of lower power or faster switching speeds.

Figure 4:
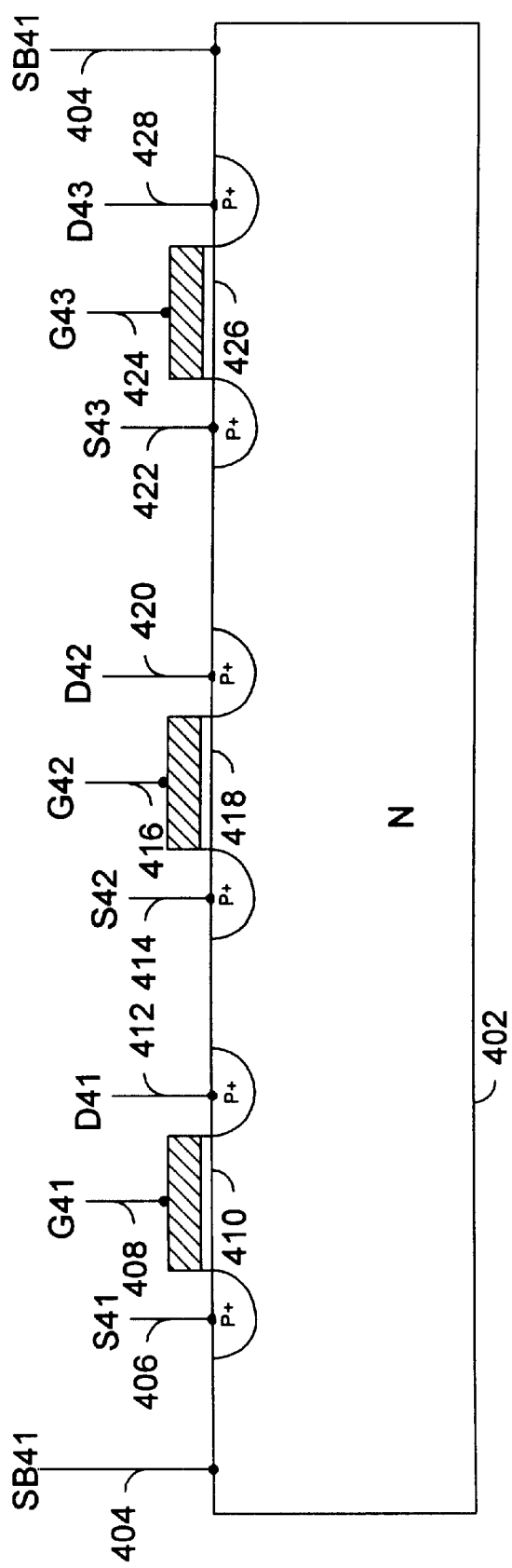
FIG. 4 is a cross-sectional drawing of three PFET transistors contained in a common Nwell area.
Figure 5:
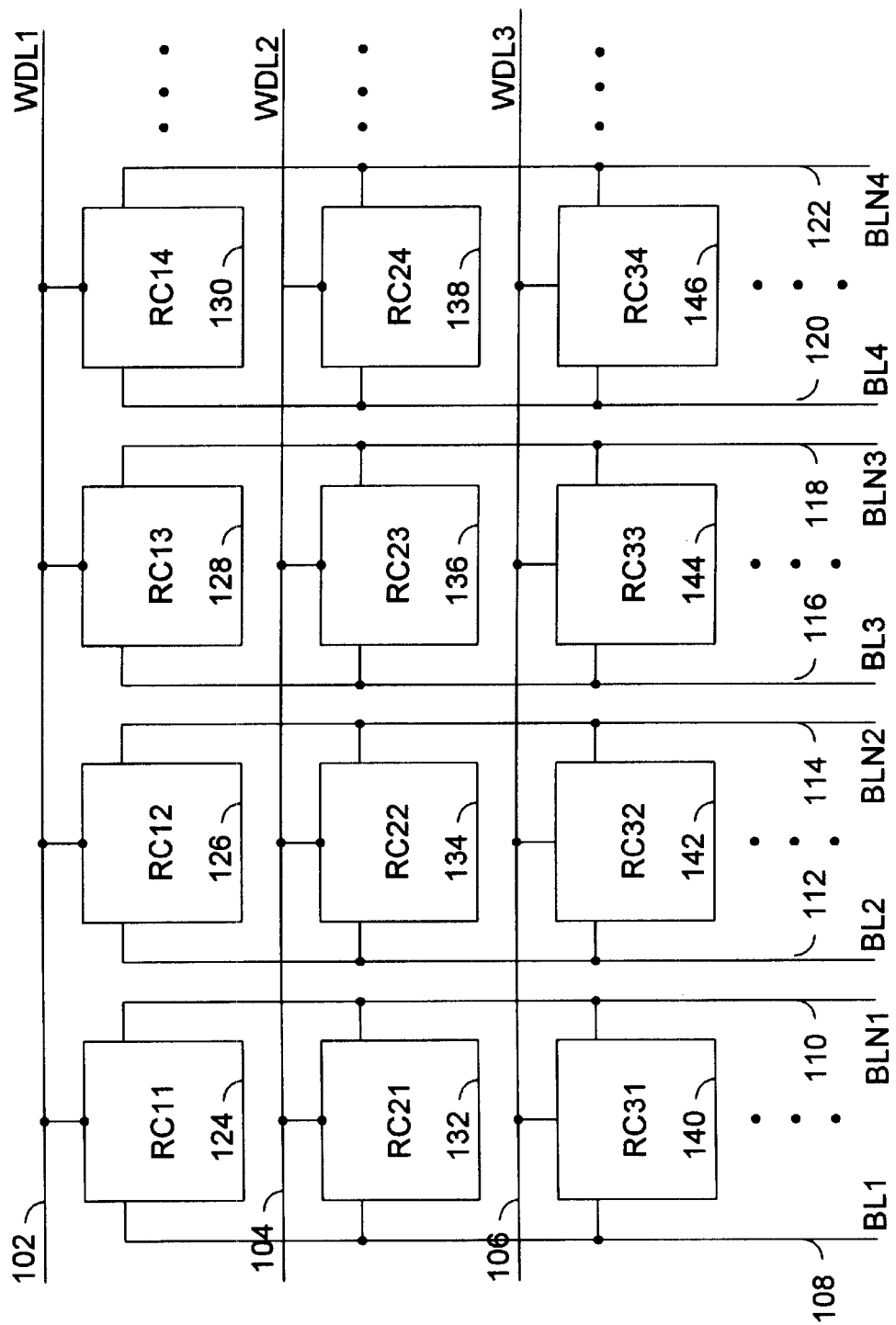
FIG. 5 is a schematic drawing of a memory array containing memory cells, wordlines, and bitlines.

FIG. 4 illustrates how contact is made to an Nwell region, 402, that contains three PFETS. All three PFETs have a common Nwell, 402. Contact to the Nwell, 402, may be made by forming ohmic contacts, 404, in the Nwell material at the ends of the Nwell, 402. The number of PFETs contained in one contiguous Nwell may vary. One example of this would be to include all the PFETs contained on a wordline of a RAM memory. FIG. 5 illustrates how a wordline is defined. Wordline, WDL1, 102 contains all the horizontal memory cells, RC11, 124, RC12, 126, RC13, 128, and RC14, 130. Another wordline WDL3, 106, contains all the horizontal memory cells, RC31, 140, RC32, 142, RC33, 144, and RC34, 146. Each wordline shown in FIG. 5 could have an individual contiguous Nwell region containing the PFETs of all the cells connected to each wordline respectively. In this way, a separate variable voltage supply could be attached to each wordline if so desired.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A circuit for reducing power in SRAM memory cells comprising:

at least one contiguous Nwell region wherein said Nwell region contains at least two PFET transistors from said SRAM memory cells;

at least one electrical contact to each of said Nwell regions;

a first variable voltage source electrically connected to said contacts of said Nwell regions;

a second variable voltage source electrically connected to positive electrical connections of said memory cells.

2. The circuit as in claim 1 wherein the SRAM memory cells are contained in a stand-alone SRAM.

3. The circuit as in claim 1 wherein the SRAM memory cells are contained on a microprocessor chip.

4. A circuit for reducing power in SRAM memory cells comprising:

at least one contiguous Nwell region wherein said Nwell region contains at least two PFET transistors from said SRAM memory cells;

at least one electrical contact to each of said Nwell regions;

a variable voltage source electrically connected to said contacts of said Nwell regions;

a fixed voltage source electrically connected to positive electrical connections of said memory cells.

5. The circuit as in claim 4 wherein the SRAM memory cells are contained in a stand-alone SRAM.

6. The circuit as in claim 4 wherein the SRAM memory cells are contained on a microprocessor chip.

7. A circuit for reducing power in SRAM memory cells comprising:

at least one contiguous Nwell region wherein said Nwell region contains at least two PFET transistors from said SRAM memory cells;

at least one electrical contact to each of said Nwell regions;

a fixed voltage source electrically connected to said contacts of said Nwell regions;

a variable voltage source electrically connected to positive electrical connections of said memory cells.

8. The circuit as in claim 7 wherein the SRAM memory cells are contained in a stand-alone SRAM.

9. The circuit as in claim 7 wherein the SRAM memory cells are contained on a microprocessor chip.

10. A circuit for reducing power in SRAM memory cells comprising:

one individual contiguous Nwell region for each wordline contained in said SRAM memory cells wherein said Nwell region contains all PFET transistors on said wordline;

at least one electrical contact to each of said Nwell regions;

a first variable voltage source electrically connected to said contacts of said Nwell regions;

a second variable voltage source electrically connected to positive electrical connections of said memory cells.

11. The circuit as in claim 10 wherein the SRAM memory cells are contained in a stand-alone SRAM.

12. The circuit as in claim 10 wherein the SRAM memory cells are contained on a microprocessor chip.

13. A circuit for reducing power in SRAM memory cells comprising:

one individual contiguous Nwell region for each wordline contained in said SRAM memory cells wherein said Nwell region contains all PFET transistors on said wordline;

at least one electrical contact to each of said Nwell regions;

a variable voltage source electrically connected to said contacts of said Nwell regions;

a fixed voltage source electrically connected to positive electrical connections of said memory cells.

14. The circuit as in claim 13 wherein the SRAM memory cells are contained in a stand-alone SRAM.

15. The circuit as in claim 13 wherein the SRAM memory cells are contained on a microprocessor chip.

16. A circuit for reducing power in SRAM memory cells comprising:

one individual contiguous Nwell region for each wordline contained in said SRAM memory cells wherein said Nwell region contains all PFET transistors on said wordline;

at least one electrical contact to each of said Nwell regions;

a fixed voltage source electrically connected to said contacts of said Nwell regions;

a variable voltage source electrically connected to positive electrical connections of said memory cells.

17. The circuit as in claim 16 wherein the SRAM memory cells are contained in a stand-alone SRAM.

18. The circuit as in claim 16 wherein the SRAM memory cells are contained on a microprocessor chip.

19. A method for reducing power in SRAM memory cells comprising:

forming at least one contiguous Nwell region wherein said Nwell region contains at least two PFET transistors from said SRAM memory cells;

forming at least one electrical contact to each of said Nwell regions;

electrically connecting a first variable voltage source to said contacts of said Nwell regions;

electrically connecting a second variable voltage source to positive electrical connections of said memory cells;

adjusting said first and second variable voltage sources such that the voltage applied to said memory cells minimizes leakage current in said SRAM memory cells.

20. A method for reducing power in SRAM memory cells comprising:

forming one individual contiguous Nwell region for each wordline contained in said SRAM memory cells wherein said Nwell region contains all PFET transistors on said wordline;

forming at least one electrical contact to each of said Nwell regions;

electrically connecting a first variable voltage source to said contacts of said Nwell regions;

electrically connecting a second variable voltage source to positive electrical connections of said memory cells;

adjusting said first and second variable voltage sources such that the voltage applied to said memory cells minimizes leakage current in said SRAM memory cells.

21. A circuit for reducing power in DRAM memory cells comprising:

at least one contiguous Nwell region wherein said Nwell region contains at least one PFET transistors from said DRAM memory cells;

at least one electrical contact to each of said Nwell regions;

a first variable voltage source electrically connected to said contacts of said Nwell regions;

a second variable voltage source electrically connected to positive electrical connections of said memory cells.

22. The circuit as in claim 21 wherein the DRAM memory cells are contained in a stand-alone DRAM.

23. The circuit as in claim 21 wherein the DRAM memory cells are contained on a microprocessor chip.

24. A circuit for reducing power in DRAM memory cells comprising:

at least one contiguous Nwell region wherein said Nwell region contains at least one PFET transistors from said DRAM memory cells;

at least one electrical contact to each of said Nwell regions;

a variable voltage source electrically connected to said contacts of said Nwell regions;

a fixed voltage source electrically connected to positive electrical connections of said memory cells.

25. The circuit as in claim 24 wherein the DRAM memory cells are contained in a stand-alone DRAM.

26. The circuit as in claim 24 wherein the DRAM memory cells are contained on a microprocessor chip.

27. A circuit for reducing power in DRAM memory cells comprising:

at least one contiguous Nwell region wherein said Nwell region contains at least one PFET transistors from said DRAM memory cells;

at least one electrical contact to each of said Nwell regions;

a fixed voltage source electrically connected to said contacts of said Nwell regions;

a variable voltage source electrically connected to positive electrical connections of said memory cells.

28. The circuit as in claim 27 wherein the DRAM memory cells are contained in a stand-alone DRAM.

29. The circuit as in claim 27 wherein the DRAM memory cells are contained on a microprocessor chip.

30. A circuit for reducing power in DRAM memory cells comprising:

one individual contiguous Nwell region for each wordline contained in said DRAM memory cells wherein said Nwell region contains all PFET transistors on said wordline;

at least one electrical contact to each of said Nwell regions;

a first variable voltage source electrically connected to said contacts of said Nwell regions;

a second variable voltage source electrically connected to positive electrical connections of said memory cells.

31. The circuit as in claim 30 wherein the DRAM memory cells are contained in a stand-alone DRAM.

32. The circuit as in claim 30 wherein the DRAM memory cells are contained on a microprocessor chip.

33. A circuit for reducing power in DRAM memory cells comprising:

one individual contiguous Nwell region for each wordline contained in said DRAM memory cells wherein said Nwell region contains all PFET transistors on said wordline;

at least one electrical contact to each of said Nwell regions;

a variable voltage source electrically connected to said contacts of said Nwell regions;

a fixed voltage source electrically connected to positive electrical connections of said memory cells.

34. The circuit as in claim 33 wherein the DRAM memory cells are contained in a stand-alone DRAM.

35. The circuit as in claim 33 wherein the DRAM memory cells are contained on a microprocessor chip.

36. A circuit for reducing power in DRAM memory cells comprising:

one individual contiguous Nwell region for each wordline contained in said DRAM memory cells wherein said Nwell region contains all PFET transistors on said wordline;

at least one electrical contact to each of said Nwell regions;

a fixed voltage source electrically connected to said contacts of said Nwell regions;

a variable voltage source electrically connected to positive electrical connections of said memory cells.

37. The circuit as in claim 36 wherein the DRAM memory cells are contained in a stand-alone DRAM.

38. The circuit as in claim 36 wherein the DRAM memory cells are contained on a microprocessor chip.

39. A method for reducing power in DRAM memory cells comprising:

forming at least one contiguous Nwell region wherein said Nwell region contains at least one PFET transistors from said DRAM memory cells;

forming at least one electrical contact to each of said Nwell regions;

electrically connecting a first variable voltage source to said contacts of said Nwell regions;

electrically connecting a second variable voltage source to positive electrical connections of said memory cells;

adjusting said first and second variable voltage sources such that the voltage applied to said memory cells minimizes leakage current in said DRAM memory cells.

40. A method for reducing power in DRAM memory cells comprising:

forming one individual contiguous Nwell region for each wordline contained in said DRAM memory cells wherein said Nwell region contains all PFET transistors on said wordline;

forming at least one electrical contact to each of said Nwell regions;

electrically connecting a first variable voltage source to said contacts of said Nwell regions;

electrically connecting a second variable voltage source to positive electrical connections of said memory cells;

adjusting said first and second variable voltage sources such that the voltage applied to said memory cells minimizes leakage current in said DRAM memory cells.

* * * * *